United States Patent
Shahar et al.

(10) Patent No.: US 9,900,852 B2
(45) Date of Patent: Feb. 20, 2018

(54) PREEMPTIVE AUTOMATIC GAIN CONTROL (AGC) FOR INTERFERENCE MITIGATION

(71) Applicant: Intel IP Corporation, Santa Clara, CA (US)

(72) Inventors: Itzik Shahar, Kadima (IL); Reuven Lavie, Hertzelia (IL); Brian J. Sublett, Menlo Park, CA (US); Anthony Tsangaropoulos, San Carlos, CA (US); Jinyong Lee, Fremont, CA (US); Dongsheng Bi, Fremont, CA (US); Dor Chay, Tel-Aviv (IL)

(73) Assignee: Intel IP Corporation, Santa Clara, CA (US)

( * ) Notice: Subject to any disclaimer, the term of this patent is extended or adjusted under 35 U.S.C. 154(b) by 170 days.

(21) Appl. No.: 14/753,529

(22) Filed: Jun. 29, 2015

(65) Prior Publication Data

US 2016/0381647 A1    Dec. 29, 2016

(51) Int. Cl.
*H04B 1/10* (2006.01)
*H04B 1/12* (2006.01)
(Continued)

(52) U.S. Cl.
CPC .......... *H04W 52/52* (2013.01); *H03G 3/3052* (2013.01); *H04B 1/1036* (2013.01);
(Continued)

(58) Field of Classification Search
CPC .... H04B 17/318; H04B 17/21; H04B 1/1027; H04B 1/1036; H04B 1/7097; H04W 72/082; H04W 52/52
See application file for complete search history.

(56) References Cited

U.S. PATENT DOCUMENTS

| 2004/0161026 A1* | 8/2004 | Jensen | H04B 17/21 |
| | | | 375/224 |
| 2012/0288042 A1 | 11/2012 | Chen et al. | |
| 2013/0156140 A1* | 6/2013 | Chari | H03G 3/3068 |
| | | | 375/345 |

FOREIGN PATENT DOCUMENTS

| WO | 2008/145800 A1 | 12/2008 |
| WO | 2014/201688 A1 | 12/2014 |

OTHER PUBLICATIONS

Office Action dated Jun. 6, 2017 for Japanese Patent Application No. 2016-106169 (with English translation).

(Continued)

*Primary Examiner* — Ayaz Sheikh
*Assistant Examiner* — Debebe Asefa
(74) *Attorney, Agent, or Firm* — Schiff Hardin LLP

(57) ABSTRACT

Described herein are technologies related to an implementation of interference mitigation in a receiver of a portable device. A preemptive-automatic gain control (AGC) system mitigates a collocated or external interfering signal in a receiver of a portable device. The receiver of the portable device receives and processes a data packet of a first radio frequency (RF) signal that includes a Bluetooth (BT) signal, a Wi-Fi signal, a near field communications (NFC), 3G, 4G, or the like. During the processing of the data packet, a collocated or an external second RF signal is detected and received by the receiver. The second RF signal includes an interfering Bluetooth (BT) uplink transmission, a near field communications (NFC) transmission signal, a Wi-Fi transmission signal, 3G or 4G uplink transmission, an LTE signal, or the like.

21 Claims, 4 Drawing Sheets

(51) Int. Cl.
*H04W 4/00* (2009.01)
*H04W 24/08* (2009.01)
*H04W 52/52* (2009.01)
*H03G 3/30* (2006.01)

(52) U.S. Cl.
CPC ............ *H04B 1/123* (2013.01); *H04W 4/008* (2013.01); *H04W 24/08* (2013.01)

(56) References Cited

OTHER PUBLICATIONS

Extended European Search report received for European Patent Application No. 16171197.3, dated Nov. 23, 016, 6 pages.

\* cited by examiner

PREEMPTIVE AUTOMATIC GAIN CONTROL (AGC) FOR INTERFERENCE MITIGATION

BACKGROUND

Typically, wireless communication receivers in portable devices may include an automatic gain control (AGC) scheme that sets an optimal receiver gain setting of the portable device. The AGC, for example, may maximize the dynamic receiver range of the portable device by amplifying the received signal to ensure that the signal-to-quantization-noise ratio (quantization noise is introduced by the A/D converters) is negligible. Furthermore, the AGC amplifies the received signal to ensure that the amplified signal is low enough that it is not clipped i.e., truncated due to signal being outside of an A/D converter.

The AGC in the portable device may sample the total wide-band energy of the received signal at the time of received signal's preamble and sets the receiver gain adjustment accordingly. In this manner, saturation of the received signal is prevented especially when the desired signals are received in the presence of same-band or adjacent-band transmissions from collocated transmitting components or devices.

However, when the collocated core or transmitting components start their transmission after the AGC gain has been set (i.e., based solely on the desired, interference-free signal), the total received signal (desired+interference) may be too strong, given the current AGC gain, and the receiver will be saturated or blocked. Consequently, the desired packet cannot be decoded and will be lost or corrupted.

As such, there is a need to implement a method or system for dynamic adjustment of the gain setting in the receiver of the portable device to address the above mentioned problems.

DETAILED DESCRIPTION

Described herein is a technology for implementing a preemptive-automatic gain control (AGC) system that mitigates a collocated or external interfering signal in a receiver of a portable device. For example, the receiver of the portable device receives and processes a data packet of a first radio frequency (RF) signal that includes a Bluetooth (BT) signal, a Wi-Fi signal, a near field communications (NFC), 3G, 4G, or the like. During the processing of the data packet, a collocated or external second RF signal is also detected and received by the receiver. The second RF signal may include an interfering Bluetooth (BT) uplink transmission, a near field communications (NFC) transmission signal, a Wi-Fi transmission signal, 3G or 4G uplink transmission, an LTE signal, or the like.

As described herein, the detection of the second RF signal includes receiving or measuring in real-time an information of the second RF signal. The information includes an occurrence frequency, an amount of transmitting power, a transmitting time, and a period of transmission of the second RF signal. Based from the received or measured information, a gain setting of an enabled preemptive-AGC system is adjusted to generate an interference-free first RF signal.

Thereafter, a received signal strength indicator (RSSI) of the interference-free first RF signal is measured and compared to a minimum detectable signal (MDS) threshold so as not to compromise a signal strength quality of the receiver. In other words, the MDS threshold is utilized to make sure that the receiver's signal strength, which corresponds to the adjusted setting of the enabled preemptive-AGC system, is enough to maintain quality in the receiver's function to receive and process data packets.

For the measured RSSI that satisfies the MDS threshold, the enabling of the preemptive-AGC system is maintained. Otherwise, the preemptive-AGC system is disabled and an AGC mode is utilized instead in the receiving and processing of the first RF signal.

Figure 1:
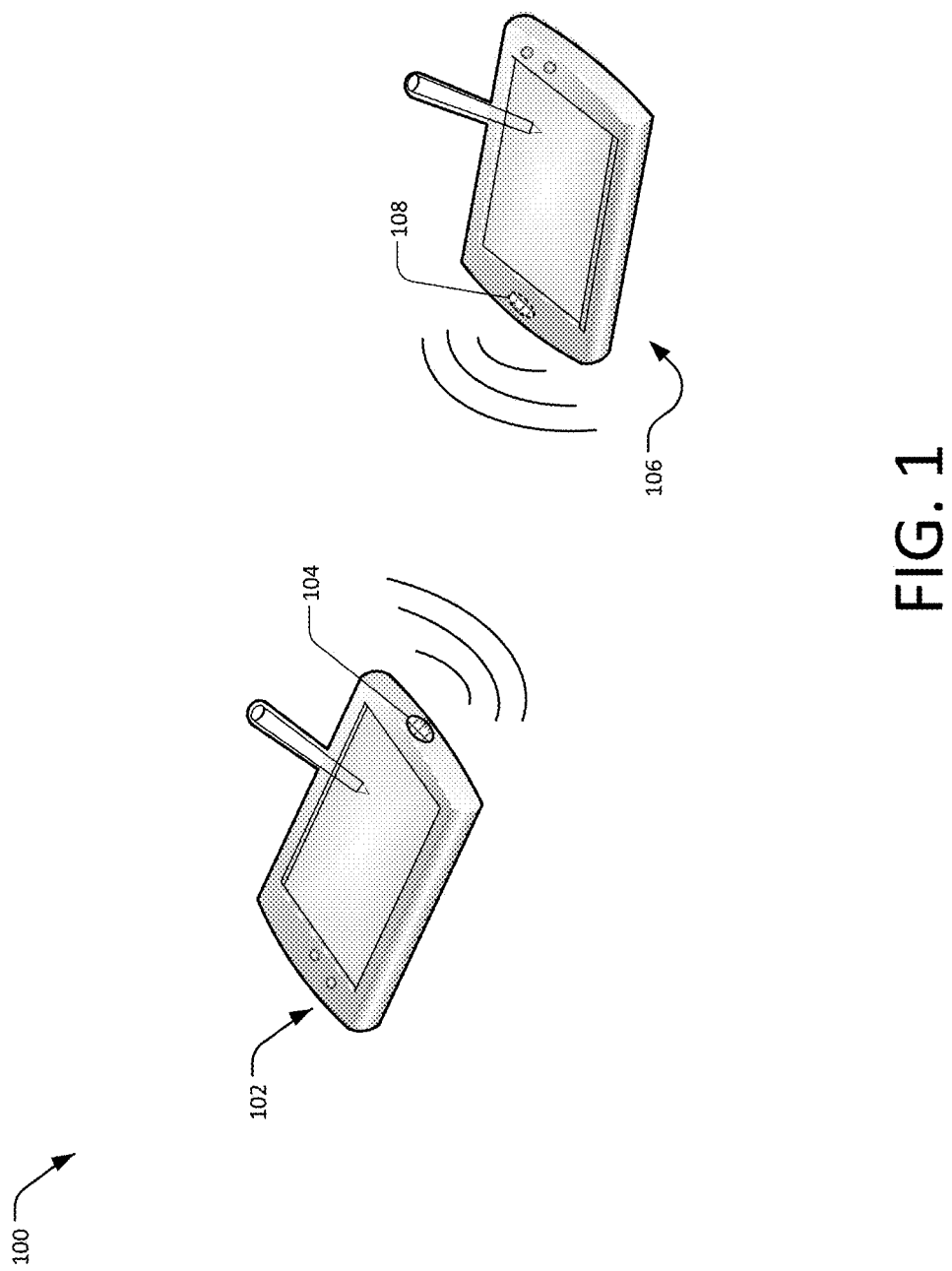
FIG. 1 illustrates an example scenario that utilizes a preemptive-automatic gain control (AGC) system or component to mitigate interference or harmonic spurs in a receiver circuitry or system of a portable device.

FIG. 1 is an example scenario 100 that utilizes a preemptive-AGC system or component to mitigate interference or harmonic spurs in a receiver circuitry or system of a portable device. The scenario 100 shows a portable device 102 with an antenna 104, and another portable device 106 with an antenna 108. As described in the implementations herein, a first RF signal (not shown) includes data packets from the Bluetooth (BT) signal, Wi-Fi signal, NFC signal, 3G signal, 4G signal, or the like, that are currently being processed by the receiver circuitry (not shown) of the portable device 102. On the other hand, a second RF signal (not shown) includes an RF signal from a collocated or external BT uplink transmission, NFC transmission signal, Wi-Fi transmission signal, 3G or 4G uplink transmission, LTE signal, or the like, that may cause corruption or interference in the processing of the data packets of the first RF signal.

The portable devices 102 or 106 may include, but is not limited to, a tablet computer, a netbook, a notebook computer, a laptop computer, mobile phone, a cellular phone, a smartphone, a personal digital assistant, a multimedia playback device, a digital music player, a digital video player, a navigational device, a digital camera, and the like.

In an implementation, the portable device 102, for example, may engage in data communication with the other portable device 106 through the use of the first RF signal such as the BT signal. While the portable device 102 is receiving and processing data packets through the BT signal, the second RF signal such as the Wi-Fi transmission signal, BT uplink transmission signal, or the like, may be detected by the receiver circuitry of the portable device 102. The second RF signal, in this example, may be generated within the same portable device 102 (i.e., collocated), or may be received from the portable device 106 (i.e., external).

As described herein, the detection of the second RF signal includes receiving or measuring in real-time an information (not shown) of the second RF signal. The information includes an amount of transmitting power and a transmitting time period of the second RF signal. Furthermore, the information may include an occurrence frequency of the second RF signal. Based from the received or measured information of the second RF signal, a preemptive-AGC component (not shown) of the portable device 102 is enabled and its gain setting is adjusted to generate an interference-free first RF signal.

Thereafter, a RSSI of the interference-free first RF signal is measured and compared by the receiver circuitry of the portable device 102 to a minimum detectable signal (MDS) threshold so as not to compromise a signal strength quality of the receiver circuitry. That is, the signal strength for the adjusted gain setting of the enabled preemptive-AGC system of the receiver circuitry is not so low such that the portable device 102 may no longer engage in data communication with the portable device 106.

Figure 2:
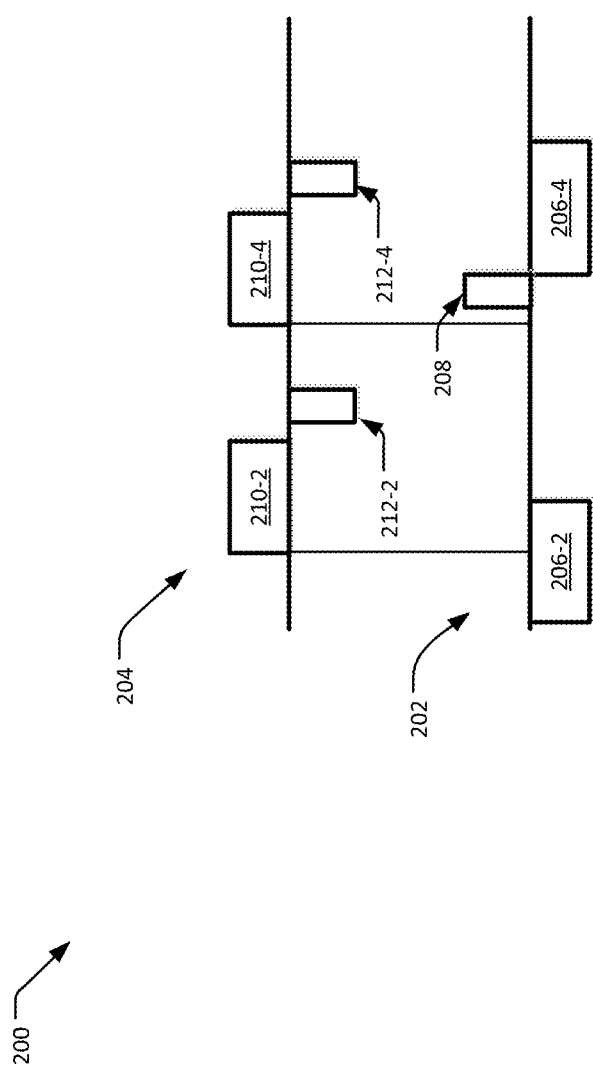
FIG. 2 is an example timeline showing an overlap between a first and a second radio frequency (RF) signals as described in accordance with implementations described herein.

FIG. 2 is an example timeline 200 showing an overlap between the first and second RF signals as described in accordance with implementations described herein. As shown, the timeline 200 includes a first RF signal 202 that may be received and processed by the portable device 102, and a collocated or external second RF signal 204 that may interfere with the processing of the first RF signal 202. The first RF signal 202 further includes data packets 206-2 and 206-4, and an uplink RF signal data packet 208. On the other hand, the collocated or external second RF signal 204 further includes transmitted signals 210-2 and 210-4, and data acknowledgments (ACKs) 212-2 and 212-4. The collocated or external transmitted signals 210-2 and 210-4 are treated herein as possible signal interferers to the data packets 206-2 and 206-4.

As described in present implementations herein, the portable device 102 may be presently receiving and processing the data packet 206-2 (of the first RF signal 202) when the transmitted signal 210-2 is transmitted by a collocated or an external transmitter (not shown). In this implementation, the occurrence frequency of the transmitted signal 210-2, which may be derived from the obtained information of the second RF signal 204, may be higher than a configured threshold value (not shown) such that an enabling of the preemptive-AGC component (not shown) is justified.

With the enabled preemptive-AGC component, a gain setting of the preemptive-AGC component is subsequently adjusted based upon the received or measured (in real time) information of the transmitted signal 210-2. That is, the gain setting adjustment may be based at least upon the received or measured transmitting power, time of transmission, and period of transmission of the transmitted signal 210-2. In this manner, the possible interfering effect of the transmitted signal 210-2 to the data packet 206-2 may be substantially minimized or eliminated.

At another instance, the collocated or external transmitted signal 210-4 may be detected by the portable device 102 prior to the receiving and processing the data packet 206-4. That is, the detection may be based upon the received or measured (in real time) information of the transmitted signal 210-4. In this case, the possible interfering effect of the transmitted signal 210-4 may be minimized or eliminated through the use of AGC mode of the portable device 102. In other words, there is no need to enable the preemptive-AGC component as the gain setting may be controlled through the AGC mode.

In an implementation, the preemptive-AGC system or component may facilitate manual gain control setting of the receiver in order to avoid corruption of the first RF signal 202. For example, the corruption of the first RF signal 102 and in particular, the data packet 206-2, is due to sudden appearance or detection of the second RF signal 204 during a period of processing of data packet 206-2. As opposed to the AGC mode, the transmitting time of the second RF signal 204 started prior to the period of processing of the data packets such as the data packet 206-4. Thus, the AGC mode may not require the manual gain control setting as described above.

Figure 3:
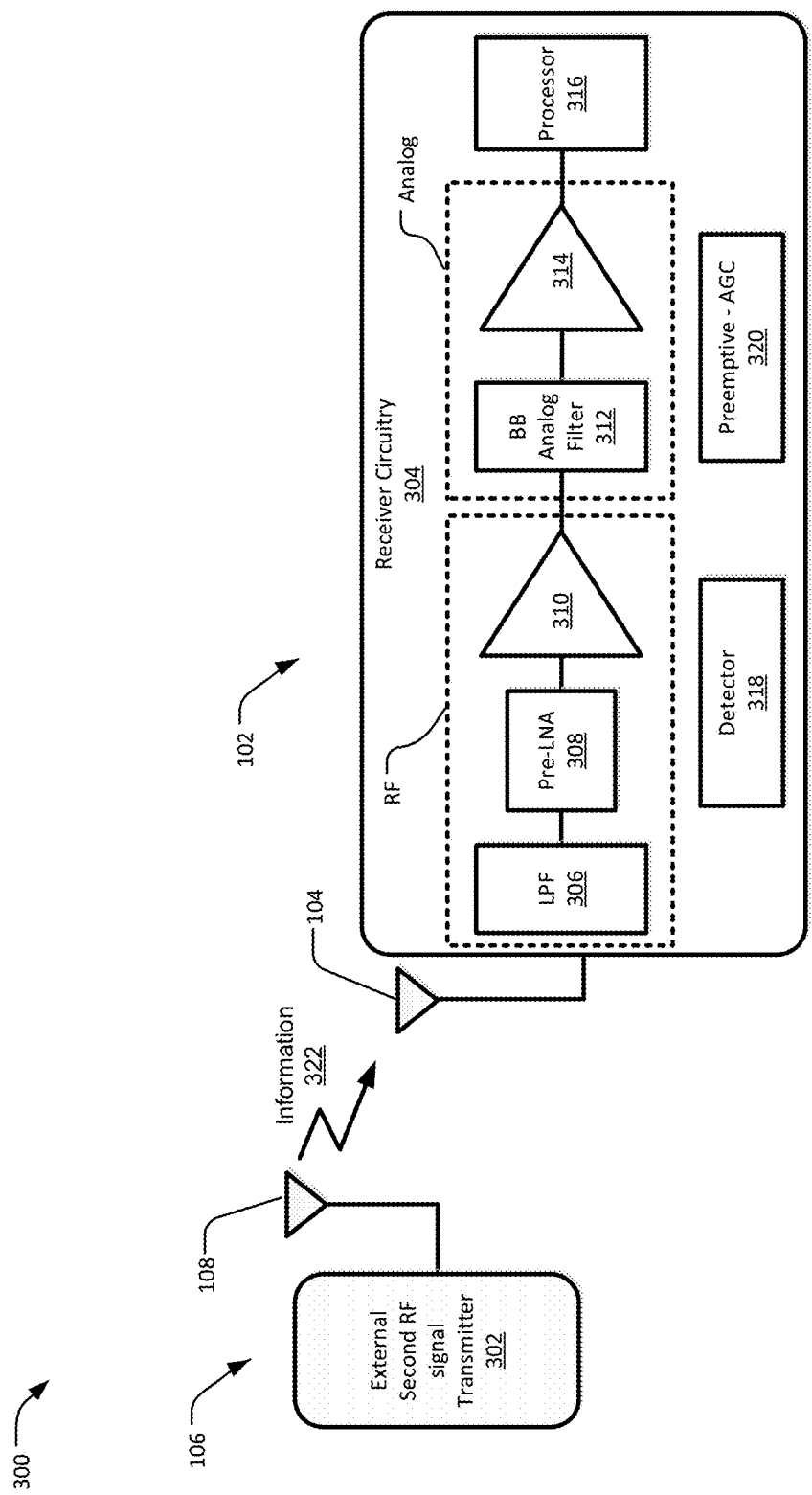
FIG. 3 illustrates an example schematic block diagram of a device receiver as described in present implementations herein.

FIG. 3 is an example schematic block diagram 300 of a device receiver as described in present implementations herein. As shown, the schematic block diagram 200 adapts the scenario 100 where the portable device 102 is processing the first RF signal 202 while the portable device 106 is transmitting the external second RF signal 204 through a transmitter component 302.

FIG. 3 further illustrates receiver circuitry 304 of the portable device 102. The receiver circuitry 304 may include the antenna 104, a low-pass filter (LPF) 306, a pre-low noise amplifier (pre-LNA) attenuator 308, a LNA 310, a baseband (BB) analog filter 312, a BB amplifier 314, and one or more processors 316. The receiver circuitry 304 may further include a detector component 318 and a preemptive-AGC component 320.

As described in present implementations herein, the detector component 318 may be configured to detect, receive, and/or measure in real time an information 322 of the second RF signal 204. For example, the information 322 may include an occurrence frequency, amount of transmission power, a period of transmission, and/or a transmit time of the second RF signal 204. In this example, the information 322 may be received directly from the transmitter 302, or the information 322 may be measured in real time (at the side) by the detector component 318. Although the illustrated second RF signal 204 is shown to be external, the same implementations as described herein may apply when the second RF signal 204 is derived within the same portable device 102.

With the gained information 322, the processor 316— which processes data packets such as the data packets 206 of the first RF signal 202—may be configured to determine whether the transmitted signals (e.g., transmitted signals 210) of the external second RF signal 204 may possibly corrupt or generate interference to the processing of the data packets 206.

For example, following the above discussion in FIG. 2, the preemptive-AGC component 320 may be enabled and its gain setting is adjusted when the transmit time of the transmitted signal 210 overlaps with the period of processing of the data packet 206. Otherwise, when the transmitted signal 210 includes the transmit time that occurs prior to the processing of the data packet 206, then the preemptive-AGC component 320 may be disabled and the AGC mode is utilized instead.

With continuing reference to FIG. 3, the detector component 318—using the obtained information 322—may be further configured to compare the amount or value of the occurrence frequency of the second RF signal 204 to the configured threshold value. For example, the configured threshold value may be utilized as a basis for enabling of the preemptive-AGC component 320. In this example, if the amount of occurrence frequency is greater than the threshold value, then the preemptive-AGC component 320 is enabled. Otherwise, it is disabled and the AGC mode of the receiver circuitry 304 is utilized instead until the detector component 318 may detect the amount of occurrence frequency that satisfies the threshold value in succeeding information 322.

With the enabled preemptive-AGC component 320, the preemptive-AGC component 320 may be configured to include a gain setting adjustment that is based upon the received or measured information 322. The gain setting adjustment of the enabled preemptive-AGC component 320, for example, may generate an interference-free first RF signal 202 by suppressing the interfering effect of the transmitted signal 210 of the second RF signal 204.

In an implementation, the detector component 318 may be configured to measure the RSSI of the interference-free first RF signal 202 and compare the measured RSSI to a minimum detectable signal (MDS) threshold. In this implementation, the comparison to the MDS threshold is implemented in order to assure the signal strength quality in the receiver circuitry 304. That is, the RSSI of the interference-free first RF signal 202 should not be small enough to compromise the ability of the receiver circuitry 304 to engage in data communications (i.e., receiving and processing of the data packets 206).

In the case where the RSSI of the interference-free first RF signal 202 satisfies the MDS threshold, the enabling of the preemptive-AGC component 320 is maintained. Otherwise, the preemptive-AGC component 320 is disabled and the AGC mode is utilized.

For the enabled preemptive-AGC component 320, its gain setting adjustment may utilize the LUT (not shown), or may utilize a stored interference-history that includes a most recent gain setting adjustment for the data packet 206 that would have been affected by the second RF signal 204.

For example, the LUT may utilize the information 322 of the second RF signal 204 in order to extract the necessary gain setting to minimize the interference in the data packet 206 that is being processed by the processor 316. In this example, the LUT may include gain setting parameters that correspond to the information 322, which includes the time of transmission, period of transmission, and the transmitting power of the transmitted signal 210. In another example, the interference-history may include the previous gain setting of the preemptive-AGC component 320 that minimized or eliminated data packet corruption in previous data packets. In this example, the interference-history may be stored in a memory component (not shown) of the portable device 102.

As described in present implementations herein, the external second RF signal 204 may be received through the antenna 104; filtered through the LPF 306 to generate a low frequency second RF signal 204; and further processed through the pre-LNA 308, amplifier 310, BB analog filter 312, BB amplifier 314, and the processor 316 for demodulation of the data packets. The processor 316, for example, may be implemented in any suitable hardware, software, firmware, or a combination thereof.

Figure 4:
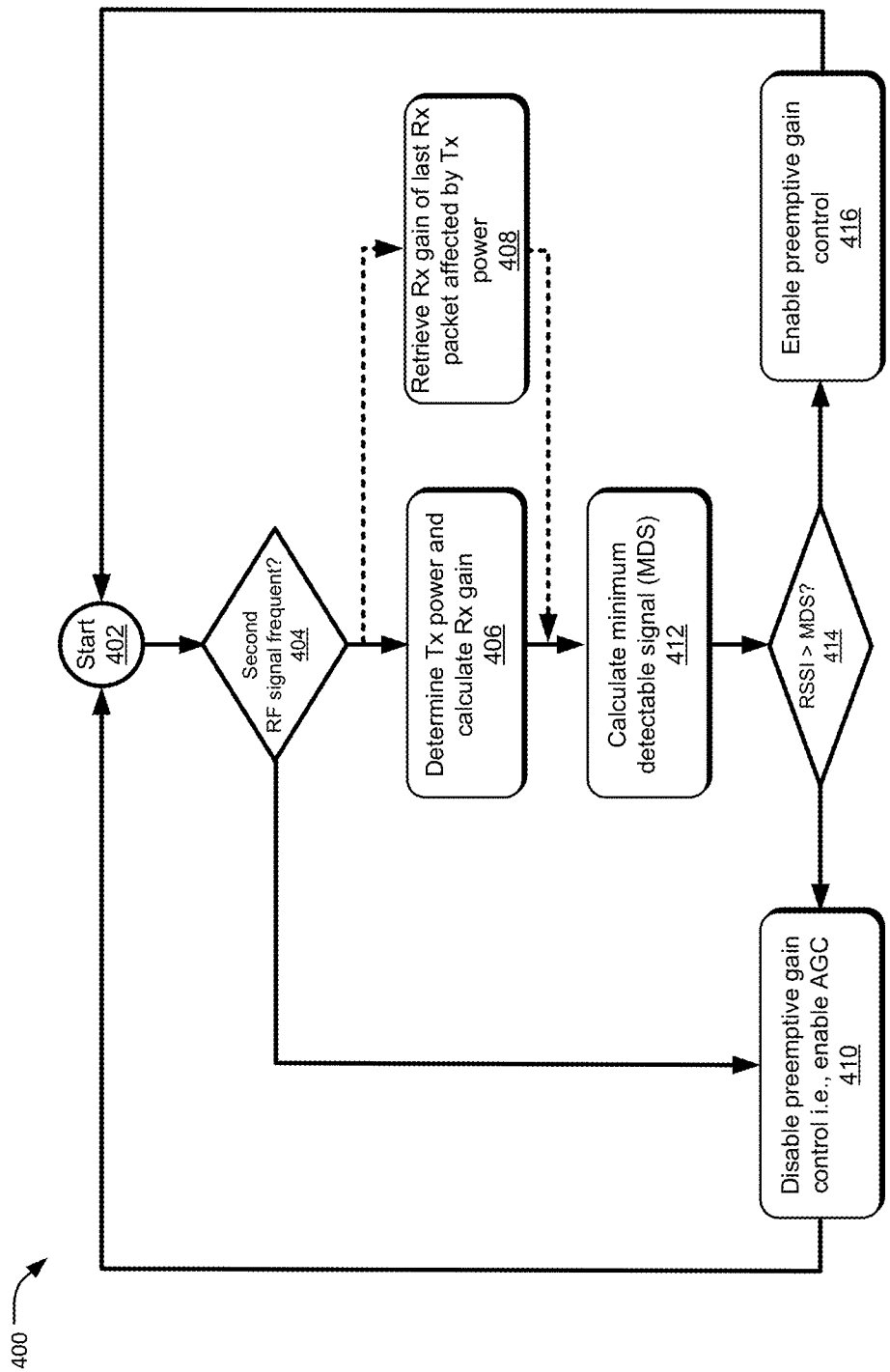
FIG. 4 illustrates an exemplary process for implementing preemptive-automatic gain control (AGC) system in a receiver circuitry of a portable device.

FIG. 4 shows an example process flowchart 400 illustrating an example method for implementing preemptive-AGC system in a receiver circuitry of a portable device. The order in which the method is described is not intended to be construed as a limitation, and any number of the described method blocks may be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 402, receiving, detecting, or measuring in real time an information of a second RF signal is performed. For example, the information 322 may include the occurrence frequency, time of transmission, period of transmission, and the transmitting power of the transmitted signal 210 in the second RF signal 204. In this example, the detector component 318 may be configured to obtain the information 322.

At block 404, determining an occurrence frequency of the second RF signal is performed. For example, the occurrence frequency may be derived from the obtained information 322. In this example, the detector component 318 may be configured to compare the determined occurrence frequency to a threshold value. The threshold value is configured to include a value that corresponds to a minimum number of occurrence frequency to justify enabling of the preemptive-AGC 320.

For example, when the occurrence frequency is greater than the threshold value, then at block 406, a determination of a gain setting adjustment of the preemptive-AGC 320 is performed. In this example, the gain setting adjustment may be derived from the LUT that further utilizes the obtained information 322 of the second RF signal 204. Alternatively, the gain setting adjustment may be implemented through the use the stored interference-history at block 408, which also utilizes the obtained information 322. Furthermore still, the gain setting adjustment at block 406 or 408, through the use of the preemptive-AGC 320, may generate the interference-free first RF signal 202.

At block 410, the preemptive-AGC is disabled when the occurrence frequency is lower than the threshold value, At block 412, calculating a MDS is performed. For example, the detector component 318 is configured to calculate the MDS threshold that corresponds to a particular gain setting where the signal strength quality of the receiver circuitry 304 of the portable device 102 is maintained.

At block 414, comparing a RSSI of the interference-free second frequency RF signal to the MDS is performed. For example, in a case where the RSSI is greater than the MDS, then at block 416, the preemptive-AGC 320 is enabled. In other words, a manual gain setting is implemented in the receiver circuitry 304 of the portable device 102. Otherwise, the preemptive-AGC 320 is disabled.

The following examples pertain to further embodiments:

Example 1 is a method of mitigating interference in a receiver of a device comprising: receiving and processing a data packet of a first radio frequency (RF) signal; detecting a collocated or external second RF signal during the processing of the data packet; adjusting a gain setting of an enabled preemptive-automatic gain control (AGC) in response to detecting the second RF signal to generate an interference-free first RF signal; and demodulating a received data packet of the interference-free first RF signal.

In example 2, the method as recited in example 1, the method as recited in claim 1, wherein the adjusting the gain setting of the enabled preemptive-AGC comprises referencing a look-up-table (LUT).

In example 3, the method as recited in example 1, wherein the adjusting of the gain setting of the enabled preemptive-AGC comprises referencing a stored interference-history that comprises a most recent setting adjustment that eliminated data packet corruption in previous data packets.

In example 4, the method as recited in example 1, wherein detecting the collocated or external second RF signal comprises referencing information received from a transmitter of the second RF signal.

In example 5, the method as recited in example 4, wherein the information comprises an amount of transmitting power and a transmitting time period of the second RF signal.

In example 6, the method as recited in example 1, wherein receiving the data packet of a first radio frequency (RF) signal comprises receiving the data packet over at least one of a Bluetooth (BT) communications link, a near field communications (NFC) communications link, a Wi-Fi communications link, a 3G communications link, a 4G communications link, or an LTE communications link.

In example 7, the method as recited any of examples 1 to 6, wherein detecting the collocated or external second RF signal comprises referencing information measured in real time by the receiver, wherein the information comprises an amount of transmitting power and a transmitting time period of the second RF signal.

In example 8, the method as recited in example 1 further comprising: comparing an occurrence frequency of the second RF signal to a threshold value; measuring a received signal strength indicator (RSSI) of the interference-free first RF signal; comparing the measured RSSI to a minimum detectable signal (MDS), wherein the MDS comprises a particular preemptive-AGC gain setting that corresponds to a minimum RSSI for signal detection; and enabling the preemptive-AGC when the occurrence frequency and the measured RSSI satisfy the threshold value and the MDS.

Example 9 is a device receiver comprising: a processor configured to process a data packet of a first radio frequency (RF) signal; a detector component configured to receive or measure in real time information about a collocated or external second RF signal during the processing of the data packet, wherein the information comprises an amount of transmitting power and a transmitting time of the second RF signal; and a preemptive-automatic gain control (AGC) component configured to implement a gain setting adjustment based upon the received or measured information.

In example 10, the device receiver of example 9, wherein the detector component is further configured to: compare an occurrence frequency of the second RF signal to a threshold value; measure a received signal strength indicator (RSSI) of an interference-free first RF signal; and compare the measured RSSI to a minimum detectable signal (MDS), wherein the preemptive-AGC is enabled for the threshold value and the RSSI that satisfy the occurrence frequency and the MDS.

In example 11, the device receiver of example 10, wherein the preemptive-AGC component is disabled and an automatic gain control (AGC) mode is enabled if the threshold value or the MDS is not reached.

In example 12, the device receiver of example 9, wherein the adjusting the gain setting of the preemptive-AGC is based from a look-up-table (LUT) that utilizes the received or measured information.

In example 13, the device receiver of example 9, wherein the data packet of the first radio frequency (RF) signal comprises receiving the data packet over at least one of a Bluetooth (BT) communications link, a near field communications (NFC) communications link, a Wi-Fi communications link, a 3G communications link, a 4G communications link, or an LTE communications link.

In example 14, the device receiver of example 9, wherein the data packet of the second radio frequency (RF) signal comprises receiving the data packet over at least one of a Bluetooth (BT) communications link, a near field communications (NFC) communications link, a Wi-Fi communications link, a 3G communications link, a 4G communications link, or an LTE communications link.

In example 15, the device receiver of example in any of examples 9 to 14, wherein the gain setting adjustment of the preemptive-AGC is based from a stored interference-history that comprises a most recent setting adjustment that eliminated data packet corruption in previous data packets.

Example 16 is a method of interference mitigation in a receiver, the method comprising: receiving and processing a data packet of a first radio frequency (RF) signal; detecting a collocated or external second RF signal during the processing of the data packet; identifying an occurrence frequency of the second RF signal; adjusting a gain setting of a preemptive-automatic gain control (AGC) based upon the detected presence of the second RF signal; measuring a received signal strength indicator (RSSI) of an interference-free first RF signal; and enabling the preemptive AGC based upon the determined occurrence frequency and the measured RSSI.

In example 17, the method as recited in example 16 further comprising: comparing the measured RSSI to a minimum detectable signal (MDS), wherein enabling the preemptive AGC comprises enabling the preemptive AGC only if the measured RSSI is greater than the MDS.

In example 18, the method as recited in example 17, further comprising: disabling the preemptive-AGC when either the threshold value or the MDS is not satisfied.

In example 19, the method as recited in example 16, wherein the adjusting the gain setting of the enabled preemptive-AGC is based from a look-up-table (LUT).

In example 20, the method as recited in example 16, wherein the detecting presence is based on information from a transmitter of the second RF signal, or based on real time information measured by the receiver, wherein the information comprises an amount of transmitting power and an expected transmitting time of the second RF signal.

In example 21, the method as recited in any of examples 16 to 20 further comprising: comparing the occurrence frequency to a threshold value, wherein enabling the preemptive AGC comprises enabling the preemptive AGC if the occurrence frequency is greater than the threshold value.

What is claimed is:

1. A method of mitigating interference in a receiver of a device comprising:
   receiving and processing a data packet of a first radio frequency (RF) signal;
   detecting a collocated or external second RF signal during the processing of the data packet;
   determining an amount of transmitting power of the second RF signal and a transmitting time period of the second RF signal;
   adjusting a gain setting of an enabled preemptive-automatic gain control (AGC) in response to detecting the second RF signal and based on the determined amount of transmitting power and the transmitting time period of the second RF signal to generate an interference-free first RF signal; and
   demodulating a received data packet of the interference-free first RF signal.

2. The method as recited in claim 1, wherein the adjusting the gain setting of the enabled preemptive-AGC comprises referencing a look-up-table (LUT).

3. The method as recited in claim 1, wherein the adjusting of the gain setting of the enabled preemptive-AGC comprises referencing a stored interference-history that comprises a most recent setting adjustment that eliminated data packet corruption in previous data packets.

4. The method as recited in claim 1, wherein detecting the collocated or external second RF signal comprises referencing information received from a transmitter of the second RF signal.

5. The method as recited in claim 4, wherein the information comprises the amount of transmitting power and the transmitting time period of the second RF signal.

6. The method as recited in claim 1, wherein detecting the collocated or external second RF signal comprises referencing information measured in real time by the receiver, wherein the information comprises an amount of transmitting power and a transmitting time period of the second RF signal.

7. The method as recited in claim 1, wherein receiving the data packet of a first radio frequency (RF) signal comprises receiving the data packet over at least one of a Bluetooth (BT) communications link, a near field communications (NFC) communications link, a Wi-Fi communications link, a 3G communications link, a 4G communications link, or an LTE communications link.

8. The method as recited in claim 1, further comprising:
comparing an occurrence frequency of the second RF signal to a threshold value;
measuring a received signal strength indicator (RSSI) of the interference-free first RF signal;
comparing the measured RSSI to a minimum detectable signal (MDS), wherein the MDS comprises a particular preemptive-AGC gain setting that corresponds to a minimum RSSI for signal detection; and
enabling the preemptive-AGC when the occurrence frequency and the measured RSSI satisfy the threshold value and the MDS.

9. A device receiver comprising:
a processor configured to process a data packet of a first radio frequency (RF) signal;
a detector component configured to receive or measure in real time information about a collocated or external second RF signal during the processing of the data packet, wherein the information comprises an amount of transmitting power and a transmitting time of the second RF signal; and
a preemptive-automatic gain control (AGC) component configured to implement a gain setting adjustment based upon the received or measured information.

10. The device receiver of claim 9, wherein the detector component is further configured to:
compare an occurrence frequency of the second RF signal to a threshold value;
measure a received signal strength indicator (RSSI) of an interference-free first RF signal; and
compare the measured RSSI to a minimum detectable signal (MDS), wherein the preemptive-AGC is enabled for the threshold value and the RSSI that satisfy the occurrence frequency and the MDS.

11. The device as recited in claim 10, wherein the preemptive-AGC component is disabled and an automatic gain control (AGC) mode is enabled if the threshold value or the MDS is not reached.

12. The device receiver as recited in claim 9, wherein the adjusting the gain setting of the preemptive-AGC is based from a look-up-table (LUT) that utilizes the received or measured information.

13. The device receiver as recited in claim 9, wherein the gain setting adjustment of the preemptive-AGC is based from a stored interference-history that comprises a most recent setting adjustment that eliminated data packet corruption in previous data packets.

14. The device receiver as recited in claim 9, wherein the data packet of the first radio frequency (RF) signal comprises receiving the data packet over at least one of a Bluetooth (BT) communications link, a near field communications (NFC) communications link, a Wi-Fi communications link, a 3G communications link, a 4G communications link, or an LTE communications link.

15. The device receiver as recited in claim 9, wherein the data Packet of the second radio frequency (RF) signal comprises receiving the data packet over at least one of a Bluetooth (BT) communications link, a near field communications (NFC) communications link, a Wi-Fi communications link, a 3G communications link, a 4G communications link, or an LTE communications link.

16. A method of interference mitigation in a receiver, the method comprising:
receiving and processing a data packet of a first radio frequency (RF) signal;
detecting a collocated or external second RF signal during the processing of the data packet;
identifying an occurrence frequency of the second RF signal;
determining an amount of transmitting power of the second RF signal and a transmitting time period of the second RF signal;
adjusting a gain setting of a preemptive-automatic gain control (AGC) based upon the detected presence of the second RF signal and based on the determined amount of transmitting power and the transmitting time period of the second RF signal;
measuring a received signal strength indicator (RSSI) of an interference-free first RF signal; and
enabling the preemptive AGC based upon the determined occurrence frequency and the measured RSSI.

17. The method as recited in claim 16 further comprising: comparing the occurrence frequency to a threshold value, wherein enabling the preemptive AGC comprises enabling the preemptive AGC if the occurrence frequency is greater than the threshold value.

18. The method as recited in claim 16 further comprising: comparing the measured RSSI to a minimum detectable signal (MDS), wherein enabling the preemptive AGC comprises enabling the preemptive AGC only if the measured RSSI is greater than the MDS.

19. The method as recited in claim 17, further comprising: disabling the preemptive-AGC when either the threshold value or the MDS is not satisfied.

20. The method as recited in claim 16, wherein the adjusting the gain setting of the enabled preemptive-AGC is based from a look-up-table (LUT).

21. The method as recited in claim 16, wherein the detecting presence is based on information from a transmitter of the second RF signal, or based on real time information measured by the receiver, wherein the information comprises an amount of transmitting power and an expected transmitting time of the second RF signal.

* * * * *